US008963134B2

(12) United States Patent
Liu

(10) Patent No.: US 8,963,134 B2
(45) Date of Patent: Feb. 24, 2015

(54) DISPLAY PANEL AND METHOD FOR MANUFACTURING THE SAME

(75) Inventor: Yawei Liu, Shenzen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 195 days.

(21) Appl. No.: 13/639,361

(22) PCT Filed: Jul. 25, 2012

(86) PCT No.: PCT/CN2012/079119
§ 371 (c)(1),
(2), (4) Date: Feb. 5, 2013

(87) PCT Pub. No.: WO2013/185407
PCT Pub. Date: Dec. 19, 2013

(65) Prior Publication Data
US 2013/0334502 A1     Dec. 19, 2013

(51) Int. Cl.
*H01L 35/24*     (2006.01)

(52) U.S. Cl.
USPC .................. 257/40; 257/E51.001; 438/99

(58) Field of Classification Search
USPC ................. 257/40, E51.001; 438/99
See application file for complete search history.

(56) References Cited

U.S. PATENT DOCUMENTS 6,706,632 B2 *    3/2004   Sinha ............................ 438/690

* cited by examiner

*Primary Examiner* — Anthony Ho

(57) ABSTRACT

The present invention provides a display panel and a method for manufacturing the same. The display panel comprises a substrate, pixels, active elements and storage capacitors, and the active elements and storage capacitors are disposed in the pixels. Each of the storage capacitors includes a first storage electrode and a second storage electrode, and the second storage electrode is disposed in a recess of an insulating layer and positioned to the first storage electrode. In the method for manufacturing the display panel, portions of the insulating layer are removed to form the recesses positioned to the first storage electrodes. The present invention can increase the aperture ratio of the pixels.

20 Claims, 5 Drawing Sheets

DISPLAY PANEL AND METHOD FOR MANUFACTURING THE SAME

FIELD OF THE INVENTION

The present invention relates to a field of manufacturing display panels, and more particularly to a display panel and a method for manufacturing the same.

BACKGROUND OF THE INVENTION

Recently, with technological advantages, many types of display apparatus have been widely applied in flat panel displays (FPDs), such as liquid crystal displays (LCDs), electro luminescence (EL) displays or organic light-emitting diode (OLED) displays.

In general, a display panel of the display comprises pixels, signal lines, active elements and storage capacitors. The signal lines may be data lines and gate lines which are intersected vertically, so as to form the pixels in a matrix manner. The active elements may be thin film transistors (TFT), and the active elements and the storage capacitors are disposed in the pixels, respectively.

However, in each of the above-mentioned pixels, the active element and the storage capacitor can not used to display images, thereby decreasing an aperture ration of the pixels. Moreover, for example, in an OLED panel, the use of a large-area capacitor will decrease the aperture ration of the pixels, deteriorating a service life of the OLED panel As a result, it is necessary to provide a display panel and methods for manufacturing the same to solve the problems existing in conventional technologies such as above-mentioned.

SUMMARY OF THE INVENTION

The present invention provides a display panel and methods for manufacturing the same to solve the problem of a decreased aperture ration.

A primary object of the present invention is to provide a display panel, and the display panel comprises: a substrate; a plurality of pixels disposed on the substrate; a plurality of active elements disposed in the pixels, respectively; and a plurality of storage capacitors disposed in the pixels, respectively, wherein each of the storage capacitors includes a first storage electrode and a second storage electrode, and the second storage electrode is disposed in a recess of an insulating layer and positioned to the first storage electrode.

In one embodiment of the present invention, each of the active elements has a first thickness, and each of the storage capacitors has a second thickness, and the second thickness is less than the first thickness.

In one embodiment of the present invention, the insulating layer has a first thickness and a second thickness, and the first thickness corresponds to first electrodes of organic light-emitting display (OLED) units, and the second thickness corresponds to the first storage electrodes, and the second thickness is less than the first thickness.

In one embodiment of the present invention, the display panel further comprises a plurality of OLED units disposed in the pixels, respectively.

In one embodiment of the present invention, each of the storage capacitors has an insulating distance, and the insulating distance is less than 300 nm.

In one embodiment of the present invention, the insulating distance is in the range of 100 nm to 300 nm.

In one embodiment of the present invention, the display panel is a liquid crystal display.

In one embodiment of the present invention, a depth of the recesses is equal to or less than 200 nm.

In one embodiment of the present invention, the first electrodes are anodes of OLED units.

A secondary object of the present invention is to provide a method for manufacturing a display panel, and the method comprises: providing a substrate; forming a plurality of gate electrodes and a plurality of first storage electrodes on the substrate; forming an insulating layer to cover the gate electrodes and the first storage electrodes; removing portions of the insulating layer to form recesses positioned to the first storage electrodes; forming a plurality of source electrodes, a plurality of drain electrodes and a plurality of second storage electrodes on the insulating layer, so as to form active elements and storage capacitors, and the source electrodes and the drain electrodes are positioned above the gate electrodes, and the second storage electrodes are formed in the recesses and positioned above the first storage electrodes; and forming a plurality of first electrodes to be connected to the drain electrodes.

Another object of the present invention is to provide a method for manufacturing a display panel, and the method comprises: providing a substrate; forming a plurality of gate electrodes on the substrate; forming an insulating layer to cover the gate electrodes; forming a plurality of source electrodes, a plurality of drain electrodes and a plurality of first storage electrodes on the insulating layer; forming another insulating layer to cover the source electrodes, the drain electrodes and the first storage electrodes; removing portions of the another insulating layer to form recesses positioned to the first storage electrodes; and forming a plurality of first electrodes and a plurality of second storage electrodes on the another insulating layer, wherein the first electrodes are connected to the drain electrodes, respectively, and the second storage electrodes are formed in the recesses of the another insulating layer.

In the display panel and the method for manufacturing the same, the area of the storage capacitors in pixels can be reduced, so as to increase the aperture ratio of each of the pixels. Therefore, a light emitting area of the display units can be enlarged to improve the service life thereof. Furthermore, the display panel of the present invention is suitable for a display or electronic apparatus of high pixels per inch (FPI).

The structure and the technical means adopted by the present invention to achieve the above-mentioned and other objects can be best understood by referring to the following detailed description of the preferred embodiments and the accompanying drawings:

DETAILED DESCRIPTION OF THE PREFERRED EMBODIMENTS

Figure 1:
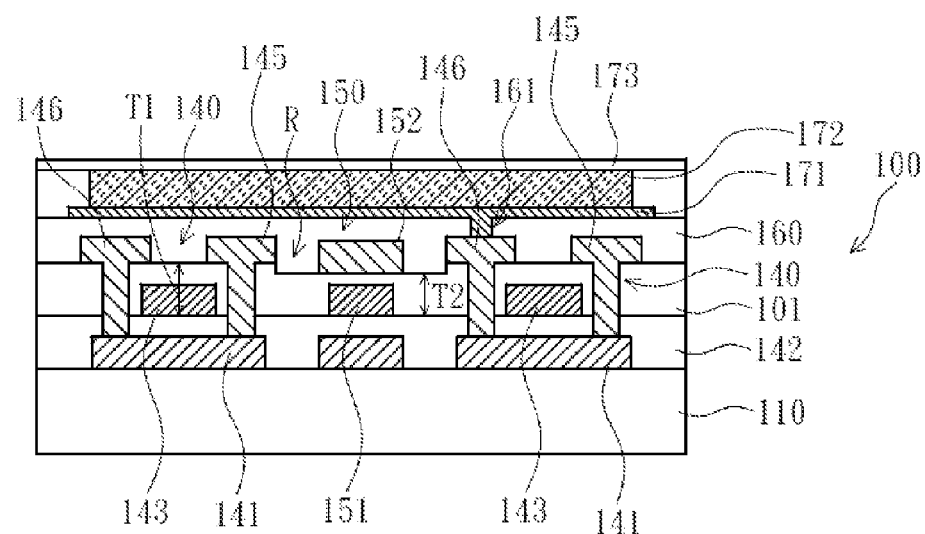
FIG. 1 is a partially cross-sectional view showing a display panel according to one embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, in the specification, unless explicitly described to the contrary, the word "comprise" and variations such as "comprises" or "comprising" will be understood to imply the inclusion of stated elements but not the exclusion of any other elements. Furthermore, in the specification, "on" implies being positioned above or below a target element and does not imply being necessarily positioned on the top on the basis of a gravity direction.

Referring to FIG. 1, a partially cross-sectional view showing a display panel according to one embodiment of the present invention is illustrated. The display panel 100 may be an OLED panel, an LCD panel and the like, for displaying images. In the present embodiment, the display panel 100 may be the OLED panel.

Figure 2:
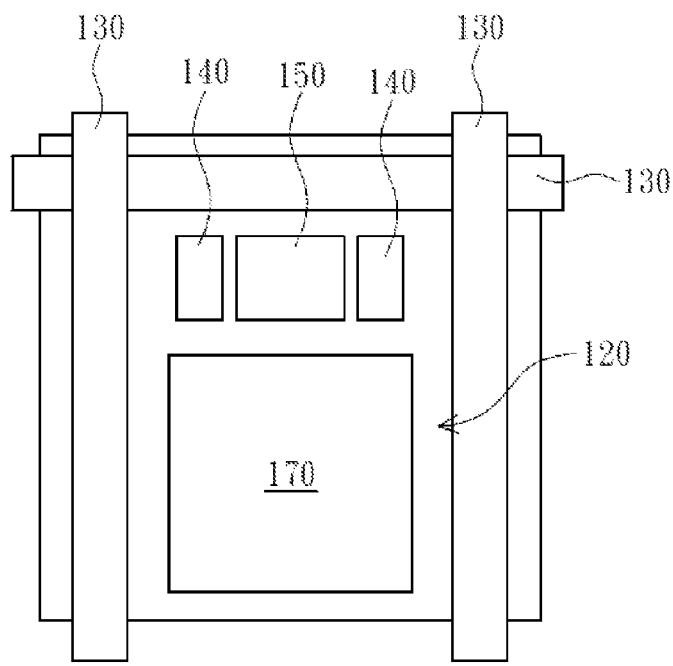
FIG. 2 is a schematic diagram showing a pixel structure according to one embodiment of the present invention.

Referring to FIG. 1 and FIG. 2, FIG. 2 is a schematic diagram showing a pixel structure according to one embodiment of the present invention. When the display panel 100 is the OLED panel, the display panel 100 can comprise a substrate 110, a plurality of pixels 120, a plurality of signal lines 130, a plurality of active elements 140, a plurality of storage capacitors 150 and a plurality of organic light-emitting display (OLED) units 170. The pixels 120 are arranged on the substrate 110 in a matrix manner. The signal lines 130 may be gate lines, data lines and power lines, wherein the gate lines insulatively cross the data lines and power lines. The active elements 140, the storage capacitors 150 and the OLED units 170 are disposed in the pixels 120, respectively. Herein, a boundary of one pixel may be defined by the gate line, the data line, and the power line, but is not limited thereto. In this embodiment, the active elements 140 may be thin film transistors (TFTs), and each of the pixels 120 can comprises two of the active elements 140 and one of the storage capacitors 150. The active elements 140 can be switching TFTs and driving TFTs. Herein, each of the storage capacitors 150 includes a first storage electrode 151 and a second storage electrode 152, and the second storage electrode 152 is disposed in a recess R of an insulating layer 101 and positioned to the first storage electrode 151. In the accompanying drawings, although the OLED panel is shown as an active matrix (AM) type organic light emitting diode display having a 2Tr-1Cap structure, which is provided with two TFTs and one storage capacitor in one pixel, the present invention is not limited thereto. Therefore, in the case of the organic light emitting diode display panel, the number of TFTs, the number of storage capacitors, and the number of wires are not limited. Meanwhile, the pixel represents the minimum unit displaying an image, and the organic light emitting diode display displays the image through the plurality of pixels.

Figure 3:
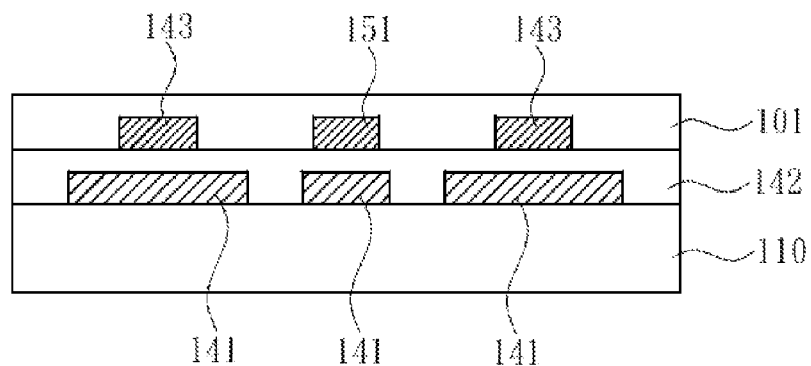
FIG. 3, FIG. 4 and FIG. 5 are schematic flow diagrams showing a process for manufacturing the display panel according to one embodiment of the present invention.
Figure 4:
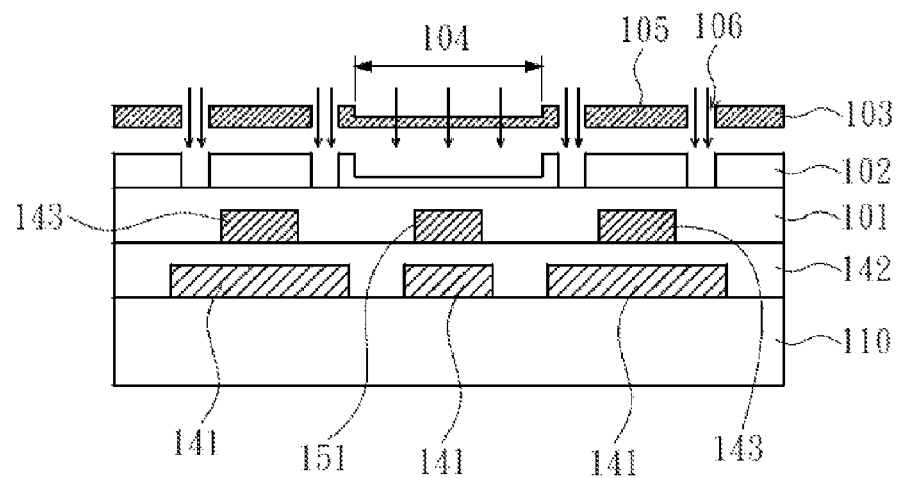
Figure 5:
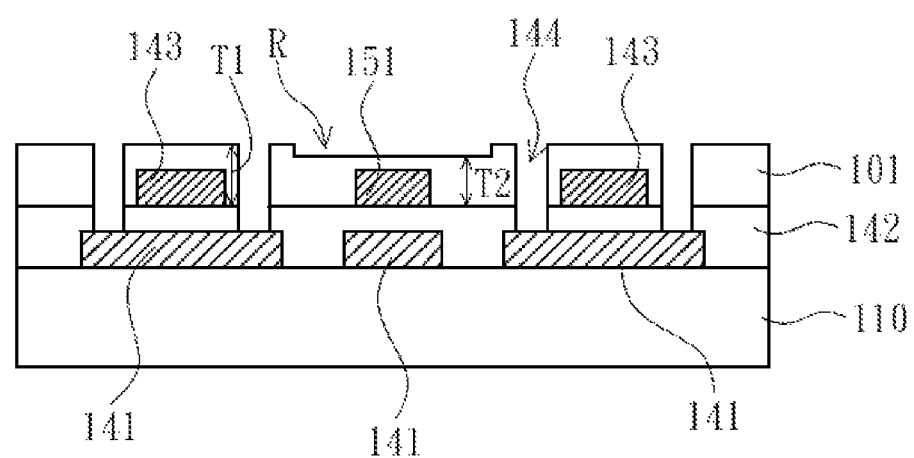

Referring to FIG. 3, FIG. 4 and FIG. 5, schematic flow diagrams showing a process for manufacturing the display panel according to one embodiment of the present invention are illustrated. In the method for manufacturing the display panel of the present embodiment, the substrate 110 is first provided. The substrate 110 may be a glass substrate, a flexible plastic substrate, a wafer substrate or a heat dissipation substrate. Subsequently, patterned semiconductor layers 141 are formed on the substrate 110. The semiconductor layer 141 may be made of amorphous silicon (a-Si) or polycrystalline silicon. In this embodiment, for forming the semiconductor layer 141, an a-Si layer can be first deposited, and then a rapid thermal annealing (RTA) step is performed for the a-Si layer, thereby allowing the a-Si layer to recrystallize into a polycrystalline silicon layer.

Referring to FIG. 3 again, subsequently, a gate insulating layer 142 is formed on the patterned semiconductor layers 141. The material of the gate insulating layer 142 may be silicon nitride ($SiN_x$) or silicon oxide ($SiO_x$) which may be formed with a plasma enhanced chemical vapor deposition (PECVD) method.

Referring to FIG. 3 again, subsequently, gate electrodes 143 and the first storage electrodes 151 are formed on the substrate 110. More specifically, the gate electrodes 143 and the first storage electrodes 151 are positioned on the gate insulating layer 142, wherein the gate electrodes 143 are positioned to the patterned semiconductor layers 141, respectively. The gate electrodes 143 can be formed by a photolithography process. The material of the gate electrodes 143 may be Al, Ag, Cu, Mo, Cr, W, Ta, Ti, metal nitride or any alloys thereof. Furthermore, the metallic layer of the gate electrodes 143 may be a multi-layer structure with heat-resistant film and lower resistance film, such as dual-layer structure with molybdenum nitride film and Al film.

Referring to FIG. 3 again, subsequently, the insulating layer 101 is formed to cover the gate electrodes 143 and the first storage electrodes 151, and the insulating layer 101 may be made of a transparent and insulating material. Subsequently, portions of the insulating layer 101 are removed to form recesses R positioned to the first storage electrodes 151, and the recesses R on the insulating layer 101 may be U-shaped recesses. Referring to FIG. 5 again, after forming the recesses R, the insulating layer 101 can have a first thickness T1 and a second thickness T2, wherein the first thickness T1 corresponds to the gate electrode 143, and the second thickness T2 corresponds to the first storage electrode 151, and the second thickness T2 is less than the first thickness T1. In this case, a thickness difference (a depth of the recesses R) between the first thickness T1 and the second thickness T2 may be equal to or less than 200 nm, such as in a range of 100 nm to 200 nm.

Referring to FIG. 4 and FIG. 5 again, before forming the recesses R, a photo-resist layer 102 of different thicknesses can be first formed on the insulating layer 101. Subsequently, the photo-resist layer 102 can be patterned to act as a photo mask, and the insulating layer 101 and the gate insulating layer 142 are etched, so as to remove portions of the insulating layer 101 and the gate insulating layer 142 which are not shielded by the patterned photo-resist layer 102, thereby forming openings 144 to expose portions of the patterned semiconductor layers 141. At this time, portions of the photo-resist layer 102 positioned above the first storage electrodes 151 have a less thickness, and another portions of the photo-resist layer 102 positioned above the gate electrodes 143 have a greater thickness. Accordingly, at the same etching rate, the portions of the insulating layer 101 positioned above the first storage electrodes 151 can be removed to form the recesses R. Subsequently, after removing the photo-resist layer 102, the patterned insulating layer 101 of different thicknesses can be achieved.

In this embodiment, referring to FIG. 4 again, the planar photo-resist layer 102 can be patterned by a multi tone mask (MTM) 103, so as to form the patterned photo-resist layer 102 of different thicknesses. The multi tone mask 103 may be a gray tone mask (GTM), a stacked layer mask (SLM) or a half tone mask (HTM). The multi tone mask 103 can include partial exposure regions 104, non-exposure regions 105 and full exposure regions 106. The partial exposure regions 104 are positioned above the photo-resist layer 102 for allowing light rays to pass through partially. In this embodiment, the partial exposure regions 104 can have a plurality of regions with different transmittances ranging, such as 40%, 50% and 60%. The non-exposure regions 105 is configured to shield off the light rays, and the full exposure regions 106 is configured to allow the light rays to pass through completely.

Therefore, by using the multi tone mask 103 to perform the photolithography process, the patterned photo-resist layer 102 can have the structure of different thicknesses. In other embodiments, the photo-resist layer of different thicknesses can be achieve by etching or deposition steps cooperating with a normal mask, but not limited to the above description.

After forming the insulating layer 101 of different thicknesses and the openings 144, subsequently, source electrodes 145, drain electrodes 146 and second storage electrodes 152 are formed on the insulating layer 101, thereby forming the active elements 140 and the storage capacitors 150 (referring to FIG. 1) on the substrate 110. The source electrodes 145 and the drain electrodes 146 are positioned above the gate electrodes 143, so as to form the active elements 140. The second storage electrodes 152 are formed on planar surfaces in the recesses R and positioned above the first storage electrodes 151, so as to form the storage capacitors 150. The material of the source electrodes 145, the drain electrodes 146 and the second storage electrodes 152 may be Al, Ag, Cu, Mo, Cr, W, Ta, Ti, metal nitride or any alloys thereof. At this time, the second storage electrodes 152 are positioned on thinner portions (of the second thickness T2) of the insulating layer 101, thereby reducing an insulating distance between the first storage electrodes 151 and the second storage electrodes 152. In this case, the insulating distance between the first storage electrodes 151 and the second storage electrodes 152 is less than a distance between the gate electrodes 143 and the source electrodes 145/the drain electrodes 146.

In this embodiment, the insulating distance between the first storage electrodes 151 and the second storage electrodes 152 may be less than 300 nm, such as in the range of 100 nm to 300 nm. A capacitance of the storage capacitors 150 is proportional to an area thereof, and inversely proportional to the insulating distance between the first storage electrodes 151 and the second storage electrodes 152. Therefore, when the capacitance of the storage capacitors 150 is constant, the area of the storage capacitors 150 can be reduced by reducing the insulating distance between the storage electrodes 151 and 152. Due to the reduction of the occupied area of the storage capacitors 150 in the pixels 120, the aperture ratio of each of the pixels 120 can increase, thereby enlarging the light emitting area thereof, as well as improving the service life of the display units (OLED units).

Subsequently, a passivation layer 160 is formed to cover the active elements 140 and the storage capacitors 150, wherein the passivation layer 160 includes contact holes 161 (referring to FIG. 1 again) to expose portions of the drain electrodes 146. In this case, the passivation layer 160 can be formed by a PECVD apparatus. Subsequently, first electrodes 171 are formed to be connected to the drain electrodes 146 of the active elements 140 (the driving TFTs). At this time, a transparent and electrically conductive layer can be first formed on the passivation layer 160, and then the transparent and electrically conductive layer is patterned to form the first electrodes 171 on the passivation layer 160 by using a photolithography process. The first electrodes 171 cover the contact holes 161 of the passivation layer 160, and thus the first electrodes 171 can be electrically connected to the drain electrodes 146 through the contact holes 161.

Subsequently, in each of the pixels 120, an organic emission layer 172 and a second electrode 172 are formed on the first electrode 171 in sequence, thereby forming the OLED unit 170 in the pixel 120 (referring to FIG. 1). In this embodiment, the first electrodes 171 are anodes which are hole injection electrodes, and the second electrodes 172 are cathodes which are electron injection electrode. Holes and electrons are injected into the organic emission layers 172 from the first electrodes 171 and the second electrodes 173, respectively. When an exciton generated by a combination of the holes and the electrons injected into the organic emission layer 172 falls from an excited state to a ground state, the organic emission layer 172 emits light. The material of the first electrodes 171 contains a single-layer or multi-layer light reflective conducting material including at least one of aluminum (Al), silver (Ag) and conducting materials having a high work function. The second electrodes 173 can contain a single-layer or multi-layer light transflective conducting material including at least one of aluminum (Al), silver (Ag), calcium (Ca), calcium-silver (CaAg), magnesium-silver (MgAg), and aluminum-silver (AlAg). In some embodiments, each of the OLED units 170 can further comprise a hole injection layer, a hole transportation layer, an electron transportation layer and an electron injection layer for improving a light emitting efficiency thereof.

Figure 6:
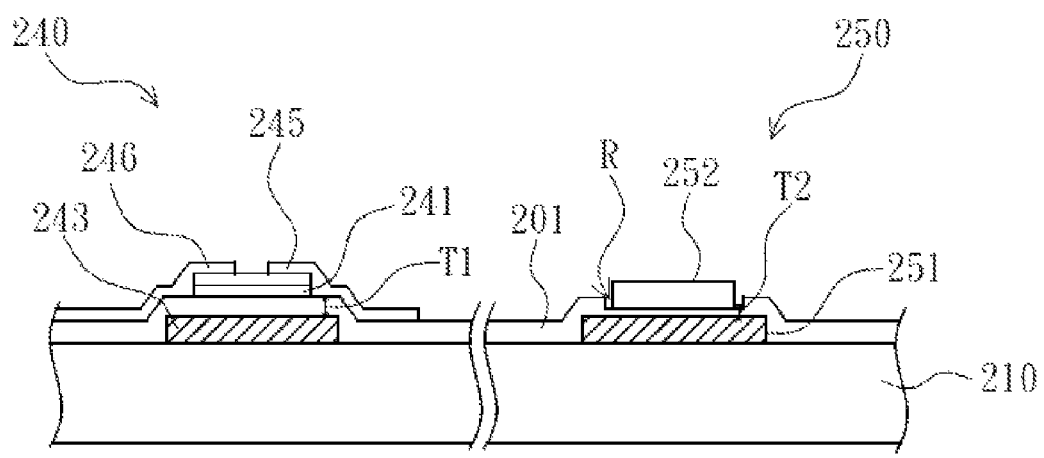
FIG. 6 is a partially cross-sectional view showing a display panel according to another embodiment of the present invention.

Referring to FIG. 6, a partially cross-sectional view showing a display panel according to another embodiment of the present invention is illustrated. In another embodiment, the display panel of the present invention may be an LCD panel. In the LCD panel, active elements 240 and storage capacitors 250 are disposed on a substrate 210. Each of the active elements 240 comprises a semiconductor layer 241, an insulating layer 201, a gate electrode 243, a source electrode 245 and a drain electrode 246. Each of the storage capacitors 250 comprises a first storage electrode 251 and a second storage electrode 252. The first storage electrode 251 and the second storage electrode 252 are positioned at two opposite sides of the insulating layer 201, and the second storage electrode 252 is formed in a recess R of the insulating layer 201 and positioned above the first storage electrode 251. The insulating layer 201 has a first thickness T1 and a second thickness T2, wherein the first thickness T1 corresponds to the gate electrode 243, and the second thickness T2 corresponds to the first storage electrode 251, and the second thickness T2 is less than the first thickness T1. Therefore, similarly, the area of the storage capacitors 250 in pixels can be reduced by reducing the insulating distance between the storage electrodes 251 and 252, so as to increase the aperture ratio of each of the pixels.

Figure 7:
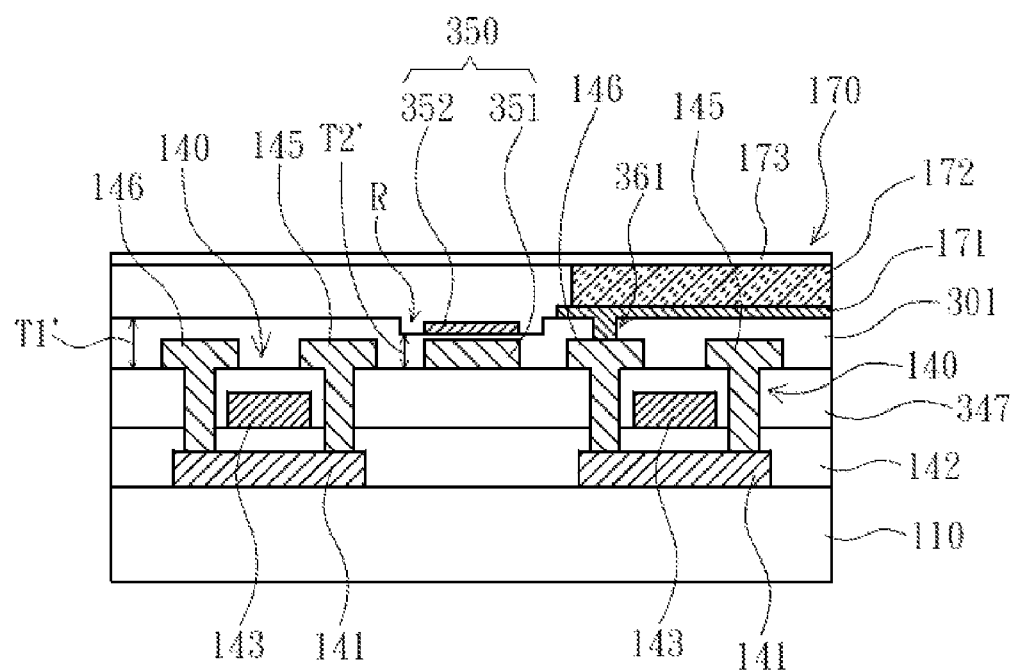
FIG. 7 is a partially cross-sectional view showing a display panel according to still another embodiment of the present invention.

Referring to FIG. 7, a partially cross-sectional view showing a display panel according to still another embodiment of the present invention is illustrated. In still another embodiment, first storage electrodes 351 are formed on an insulating layer 347 which covers gate electrodes 343, and another insulating layer 301 between the first storage electrodes 351 and second storage electrodes 352 of storage capacitors 350 can act as a passivation layer for covering the active elements 140. At this time, the first storage electrodes 351, the source electrodes 145 and the drain electrodes 146 are substantially positioned on the same plane. Moreover, the second storage electrodes 352 are formed on planar surfaces in the recesses R and positioned to the first storage electrode 351. In this embodiment, the insulating layer 301 has a first thickness T1' and a second thickness T2', wherein the first thickness T1' corresponds to the first electrodes 171 of the OLED units 170, and the second thickness T2' corresponds to the first storage electrode 351, and the second thickness T2' is less than the first thickness T1'. In this case, a thickness difference between the first thickness T1' and the second thickness T2' can be equal to or less than 200 nm, such as in the range of 100 nm to 200 nm.

In a method for manufacturing the display panel according to still another embodiment as shown in FIG. 7, the substrate 110 is first provided, and then patterned semiconductor layers 141 are formed on the substrate 110. Subsequently, the gate insulating layer 142 is formed to cover the patterned semiconductor layers 141. Subsequently, the gate electrodes 143 are formed on the substrate 110 and positioned on the gate insulating layer 142, wherein the gate electrodes 143 are positioned to the patterned semiconductor layers 141, respectively. Subsequently, the insulating layer 347 is formed to cover the gate electrodes 143. Subsequently, the source electrodes 145, the drain electrodes 146 and first storage electrodes 351 are formed on the insulating layer 347. Subsequently, the another insulating layer 301 is formed to cover the source electrodes 145, the drain electrodes 146 and first storage electrodes 351. Subsequently, portions of the insulating layer 301 which are positioned above the first storage electrodes 351 are removed, so as to form the recesses R. When forming the recesses R of the insulating layer 301, the recesses R and contact holes 361 can be formed on the insulating layer 301 by using the multi tone mask, and the contact holes 361 expose portions of the drain electrodes 146. Subsequently, the first electrodes 171 and the second storage electrodes 352 are formed on the insulating layer 301, wherein the first electrodes 171 are connected to the drain electrodes 146, respectively. The second storage electrodes 352 are formed in the recesses R of the insulating layer 301 and positioned to the first storage electrode 351. Subsequently, the organic emission layers 172 and the second electrodes 172 are formed on the first electrodes 171 in sequence, so as to form the OLED units 170.

As described above, in the display panel and the method for manufacturing the same, the area of the storage capacitors in pixels can be reduced by decreasing the insulating distance in the storage capacitors, so as to increase the aperture ratio of each of the pixels. Therefore, a light emitting area of the display units (such as the OLED units) can be enlarged to improve the service life thereof. In addition, the display panel of the present invention can have a higher aperture ratio, and thus is suitable for a display or electronic apparatus of high pixels per inch (PPI).

The present invention has been described with a preferred embodiment thereof and it is understood that many changes and modifications to the described embodiment can be carried out without departing from the scope and the spirit of the invention that is intended to be limited only by the appended claims.

The invention claimed is:
1. A display panel, comprising:
a substrate;
a plurality of pixels disposed on the substrate;
a plurality of active elements disposed in the pixels, respectively; and
a plurality of storage capacitors disposed in the pixels, respectively, wherein each of the storage capacitors includes a first storage electrode and a second storage electrode, and the second storage electrode is disposed in a recess of an insulating layer and positioned to the first storage electrode.

2. The display panel according to claim 1, wherein each of the active elements has a first thickness, and each of the storage capacitors has a second thickness, and the second thickness is less than the first thickness.

3. The display panel according to claim 1, wherein the insulating layer has a first thickness and a second thickness, and the first thickness corresponds to first electrodes of organic light-emitting display (OLED) units, and the second thickness corresponds to the first storage electrodes, and the second thickness is less than the first thickness.

4. The display panel according to claim 1, further comprising a plurality of OLED units disposed in the pixels, respectively.

5. The display panel according to claim 1, wherein each of the storage capacitors has an insulating distance, and the insulating distance is less than 300 nm.

6. The display panel according to claim 5, wherein the insulating distance is in the range of 100 nm to 300 nm.

7. The display panel according to claim 1, wherein the display panel is a liquid crystal display.

8. The display panel according to claim 1, wherein a depth of the recesses is equal to or less than 200 nm.

9. A method for manufacturing a display panel, comprising:
providing a substrate;
forming a plurality of gate electrodes and a plurality of first storage electrodes on the substrate;
forming an insulating layer to cover the gate electrodes and the first storage electrodes;
removing portions of the insulating layer to form recesses positioned to the first storage electrodes;
forming a plurality of source electrodes, a plurality of drain electrodes and a plurality of second storage electrodes on the insulating layer, so as to form active elements and storage capacitors, and the source electrodes and the drain electrodes are positioned above the gate electrodes, and the second storage electrodes are formed in the recesses and positioned above the first storage electrodes; and
forming a plurality of first electrodes to be connected to the drain electrodes.

10. The method according to claim 9, wherein each of the active elements has a first thickness, and each of the storage capacitors has a second thickness, and the second thickness is less than the first thickness.

11. The method according to claim 9, wherein each of the storage capacitors has an insulating distance, and the insulating distance is less than 300 nm.

12. The method according to claim 11, wherein the insulating distance is in the range of 100 nm to 300 nm.

13. The method according to claim 9, wherein the display panel is a liquid crystal display.

14. The method according to claim 9, wherein a depth of the recesses is equal to or less than 200 nm.

15. A method for manufacturing a display panel, comprising:
providing a substrate;
forming a plurality of gate electrodes on the substrate;
forming an insulating layer to cover the gate electrodes;
forming a plurality of source electrodes, a plurality of drain electrodes and a plurality of first storage electrodes on the insulating layer;
forming another insulating layer to cover the source electrodes, the drain electrodes and the first storage electrodes removing portions of the another insulating layer to form recesses positioned to the first storage electrodes; and
forming a plurality of first electrodes and a plurality of second storage electrodes on the another insulating layer, wherein the first electrodes are connected to the drain electrodes, respectively, and the second storage electrodes are formed in the recesses of the another insulating layer.

16. The method according to claim 15, wherein the insulating layer has a first thickness and a second thickness, and the first thickness corresponds to first electrodes of OLED units, and the second thickness corresponds to the first storage electrodes, and the second thickness is less than the first thickness.

17. The method according to claim 15, wherein each of the storage capacitors has an insulating distance, and the insulating distance is less than 300 nm.

18. The method according to claim 17, wherein the insulating distance is in the range of 100 nm to 300 nm.

19. The method according to claim 15, wherein a depth of the recesses is equal to or less than 200 nm.

20. The method according to claim 15, wherein the first electrodes are anodes of OLED units.

* * * * *